(12) United States Patent
Mulfinger et al.

(10) Patent No.: US 8,183,101 B2
(45) Date of Patent: May 22, 2012

(54) MULTIPLE GATE TRANSISTOR HAVING FINS WITH A LENGTH DEFINED BY THE GATE ELECTRODE

(75) Inventors: Robert Mulfinger, Dresden (DE); Andy Wei, Dresden (DE); Jan Hoentschel, Dresden (DE); Andrew Waite, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 184 days.

(21) Appl. No.: 12/620,265

(22) Filed: Nov. 17, 2009

(65) Prior Publication Data
US 2010/0133615 A1 Jun. 3, 2010

(30) Foreign Application Priority Data
Nov. 28, 2008 (DE) .......................... 10 2008 059 646

(51) Int. Cl.
*H01L 29/78* (2006.01)
(52) U.S. Cl. ........ 438/157; 438/254; 438/257; 438/243; 438/427; 438/142; 257/347; 257/E29.264; 257/E21.421; 257/E21.19; 257/E21.21; 257/E21.615
(58) Field of Classification Search .................. 257/347, 257/E29.264, E21.421, E21.19, E21.21, E21.615; 138/157; 438/157, 254, 257, 243, 427, 142
See application file for complete search history.

(56) References Cited

U.S. PATENT DOCUMENTS

| 2005/0020020 | A1* | 1/2005 | Collaert et al. | 438/300 |
| 2006/0160302 | A1* | 7/2006 | Kim et al. | 438/254 |
| 2006/0240622 | A1* | 10/2006 | Lee et al. | 438/257 |
| 2007/0072366 | A1* | 3/2007 | Kang et al. | 438/243 |

FOREIGN PATENT DOCUMENTS
WO  WO 2007/038575 A2  4/2007

OTHER PUBLICATIONS

Translation of Official Communication from German Patent Office for German Patent Application No. 10 2008 059 646.9 dated Feb. 19, 2010.

* cited by examiner

*Primary Examiner* — Marc Armand
(74) *Attorney, Agent, or Firm* — Williams, Morgan & Amerson

(57) ABSTRACT

The drain and source regions of a multiple gate transistor may be formed without an epitaxial growth process by using a placeholder structure for forming the drain and source dopant profiles and subsequently masking the drain and source areas and removing the placeholder structures so as to expose the channel area of the transistor. Thereafter, corresponding fins may be patterned and a gate electrode structure may be formed. Consequently, reduced cycle times may be accomplished due to the avoidance of the epitaxial growth process.

19 Claims, 7 Drawing Sheets

MULTIPLE GATE TRANSISTOR HAVING FINS WITH A LENGTH DEFINED BY THE GATE ELECTRODE

BACKGROUND OF THE INVENTION

1. Field of the Invention

Generally, the present disclosure relates to the fabrication of highly sophisticated integrated circuits including transistor elements having a double gate (FINFET) or triple gate architecture.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit elements that substantially determine performance of the integrated circuits. Generally, a plurality of process technologies are currently practiced, wherein, for many types of complex circuitry including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a planar transistor architecture, on the distance between the source and drain regions, which is also referred to as channel length.

Presently, the vast majority of integrated circuits are based on silicon due to substantially unlimited availability, the well-understood characteristics of silicon and related materials and processes and the experience gathered during the past 50 years. Therefore, silicon will likely remain the material of choice for future circuit generations designed for mass products. One reason for the dominant importance of silicon in fabricating semiconductor devices has been the superior characteristics of a silicon/silicon dioxide interface that allows reliable electrical insulation of different regions from each other. The silicon/silicon dioxide interface is stable at high temperatures and thus allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a basic gate insulation layer that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 μm may require a gate dielectric made of silicon dioxide as thin as approximately 1.2 nm. Although usage of high speed transistor elements having an extremely short channel may typically be restricted to high speed applications, whereas transistor elements with a longer channel may be used for less critical applications, such as storage transistor elements, the relatively high leakage current caused by direct tunneling of charge carriers through an ultra-thin silicon dioxide gate insulation layer may reach values for an oxide thickness in the range or 1-2 nm that may not be compatible with requirements for performance-driven circuits.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. It has, therefore, been suggested to replace silicon dioxide with high permittivity materials such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

Although significant advantages may be obtained with respect to performance and controllability of sophisticated planar transistor architectures on the basis of the above-specified strategies, in view of further device scaling, new transistor configurations have been proposed in which a "three-dimensional" architecture may be provided in an attempt to obtain a desired channel width while at the same time maintaining good controllability of the current flow through the channel region. To this end, so-called FINFETS have been proposed in which a thin sliver or fin of silicon may be formed in a thin active layer of a silicon-on-insulator (SOI) substrate, wherein, on both sidewalls, a gate dielectric material and a gate electrode material may be provided, thereby realizing a double gate transistor, the channel region of which may be fully depleted. Typically, in sophisticated applications, the width of the silicon fins is on the order of 10 nm and the height thereof is on the order of 30 nm. In a modified version of the basic double gate transistor architecture, a gate dielectric material and a gate electrode may be formed on a top surface of the fin, thereby realizing a tri-gate transistor architecture.

Thus, FINFET transistor architectures, which may also be referred to herein as multiple gate transistors, may provide advantages with respect to increasing the effective coupling of the gate electrode to the various channel regions without requiring a corresponding reduction in the thickness of the gate dielectric material. Moreover, by providing this non-planar transistor architecture, the effective channel width may be increased so that, for given overall transistor dimensions, an enhanced current drive capability may be accomplished. For these reasons, great efforts have been made in order to provide enhanced transistor performance on the basis of non-planar transistor architectures wherein, however, sophisticated manufacturing processes may conventionally be used, such as selective epitaxial growth techniques, which may result in a significantly reduced overall throughput, since corresponding epitaxial growth processes may typically be performed on a single substrate basis. With reference to FIGS. 1a-1g, a typical conventional process flow for forming a multiple gate transistor is described in more detail in order to more clearly demonstrate the basic configuration and the process techniques involved.

FIG. 1a schematically illustrates a perspective view of a transistor element 100, which may be referred to as a FINFET transistor or multiple gate transistor. As illustrated, the transistor 100 comprises a substrate 101 above which is formed a base layer 102, such as a silicon layer and the like. Moreover, a plurality of fins 110 are formed above the layer 102 and may be comprised of any appropriate semiconductor material, such as silicon, silicon/germanium and the like. As will be explained later on in more detail, the fins 110 may be formed on the basis of an epitaxially grown semiconductor material that may be deposited on the base layer 102, while, in other cases, sophisticated process techniques may be applied in order to provide an SOI configuration wherein the base layer 102 may represent an insulating material, such as silicon dioxide and the like. Furthermore, a gate electrode structure 120 is formed above a central portion of the fins 110, wherein the gate electrode structure 120 may comprise an appropriate gate dielectric material, such as silicon dioxide, in combination with an appropriate electrode material, typically a polysilicon material. Thus, each of the fins 110 in combination with the common gate electrode structure 120 may represent a single transistor cell of the device 100. In the example shown, the fins 110 may have formed thereon a cap layer 112 which may also extend through the gate electrode structure 120, if a top surface of the fins 110 should not act as a channel region. On the other hand, respective sidewalls surfaces 110A, 110B of the fins 110 may represent corresponding channel regions, the conductivity of which is controlled by the gate electrode 120. It should be appreciated that the fins 110 may exhibit an appropriate dopant concentration so as to define corresponding drain and source areas in each of the fins 110, while in other strategies corresponding drain and source regions may be formed in a later stage after connecting the end portions of the fins 110 by growing a further semiconductor material to fill the spacing between the individual fins 110.

FIG. 1b schematically illustrates a top view of the device 100 in an early manufacturing stage. As illustrated, the fins 110 may be formed with lateral dimensions in accordance with the overall design rules for the device 100.

FIG. 1c schematically illustrates a cross-sectional view of the device 100 of FIG. 1b along the line Ic. As illustrated, the fins 110 may extend down to the base layer 102, which may be accomplished on the basis of sophisticated lithography and etch techniques in which a semiconductor material, such as a silicon material and the like, may be etched. Typically, the semiconductor material of the fins 110 may be formed on the basis of epitaxial growth techniques, which may thus result in reduced throughput since this deposition technique may usually be performed on the basis of process tools processing a single substrate at a time. It should be appreciated that, depending on the overall process strategy, a cap material, such as the cap layer 112 (FIG. 1a), may be provided prior to patterning the fins 110 if the top surface of the fins 110 is not to be used as a channel region. Furthermore, prior to or after patterning the fins 110, a basic dopant profile may be established, for instance with respect to defining the basic conductivity type of the fins and the like. This may be accomplished by implantation techniques and/or by incorporating a desired dopant species during the epitaxial growth process for forming the material for the fins 110. Next, the gate electrode structure 120 (FIG. 1a) is formed, for instance by forming an appropriate gate dielectric material, such as a silicon dioxide, which may be accomplished by sophisticated oxidation techniques and the like, followed by the deposition of the gate electrode material, such as polysilicon. After planarizing the electrode material, which may also comprise appropriate materials for forming a hard mask, adjusting the overall optical characteristics on the basis of an anti-reflective coating (ARC) material and the like, the electrode material may be patterned by using a resist mask obtained by lithography and performing an appropriate etch sequence, wherein a high degree of etch selectivity between the gate electrode material and the gate dielectric material may provide integrity of the end portions of the fins 110. For example, well-established process techniques are available for etching polysilicon material selectively to silicon dioxide.

FIG. 1d schematically illustrates a top view of the device 100 after the above-described process sequence and after the removal of any resist materials and other sacrificial materials used for patterning the gate electrode structure 120. As illustrated, the gate electrode structure 120 may have appropriate lateral dimensions so as to cover a central portion of the fins 110 and thereby defining corresponding channel lengths for each of the fins 110. Furthermore, the fins 110 may be covered by a gate dielectric material 121, such as silicon dioxide and the like, as previously explained.

FIG. 1e schematically illustrates a cross-sectional view along the line Ic, as shown in FIG. 1d. As illustrated, the gate electrode structure 120 may comprise a gate electrode material 122 that is formed between the spacing of adjacent fins 110, which are covered by the gate dielectric material 121. In the example shown, it may be assumed that each surface area, i.e., both sidewalls 110A, 110B and a top surface 110T, may act as actual channel regions, which are controlled by the surrounding gate electrode material 122 so that each of the surface areas 110A, 110B and 110T may be considered as being controlled by a dedicated gate electrode. After forming the gate electrode structure 120, drain and source areas may be formed, for instance, by ion implantation, which may include the deposition of a spacer material and patterning the same, if required, while in other cases a semiconductor material may be formed first in order to electrically connect end portions of the fins at both sides of the gate electrode structure 120 in order to provide respective drain and source areas. For this purpose, the end portions of the fins 110 not covered by the gate electrode structure 120 may be exposed by removing the gate dielectric material 121, which may be accomplished by well-established etch recipes, for instance on the basis of hydrofluoric acid and the like. Thereafter, the exposed surface portions of the fins 110 may be prepared for a subsequent selective epitaxial growth process, which may involve well-established cleaning processes and the like. As previously explained, the epitaxial growth process may require sophisticated process tools, which may operate on a single substrate basis, thereby also significantly reducing the throughput of the entire manufacturing flow.

FIG. 1*f* schematically illustrates a top view of the device 100 after completing the selective epitaxial growth process, thereby forming a silicon material or a silicon/germanium material 131 at both sides of the gate electrode structure 120, thereby defining a drain area 130D and a source area 130S. Thus, as illustrated, the fins 110 may be connected with one end portion thereof to the drain area 130D and may be connected with another end portion thereof with the source area 130S.

FIG. 1*g* schematically illustrates a cross-sectional view through the drain area 130D wherein it is illustrated that the epitaxially grown material 131 is in direct contact with the fins 110, thereby providing a continuous drain region, the conductivity thereof may be appropriately adapted by ion implantation and the like, wherein corresponding spacer structures may be formed, as previously discussed, to provide a desired dopant concentration gradient in the vicinity of the gate electrode structure 120 (FIG. 1*f*).

After generating the desired dopant profile in the drain and source areas 130D, 130S, any further processes may be performed, such as anneal processes and the like, followed by the deposition of an appropriate interlayer dielectric material, for instance in the form of silicon dioxide, in combination with an appropriate etch stop material, such as silicon nitride, which may then be patterned so as to obtain contact openings which are subsequently filled with an appropriate conductive material, such as tungsten and the like.

It should be appreciated that a plurality of sophisticated manufacturing techniques are typically used in planar transistor configurations for enhancing overall transistor performance. For example, appropriate strain may be created in the channel region of planar transistors and also sophisticated gate dielectric materials in combination with highly conductive gate electrode materials may frequently be used in order to enhance channel controllability and reduce signal propagation delay. Although the non-planar transistor configuration of the device 100 may provide significant advantages with respect to the overall transistor performance, it is nevertheless highly desirable to also incorporate further performance enhancing mechanisms, which, however, additionally contribute to a further increased overall complexity. That is, due to the epitaxial growth processes which may be required, at least for defining the drain and source areas 130D, 130S, possibly in combination with additional performance enhancing strategies, the resulting manufacturing flow may not be compatible with demands for high throughput, thereby rendering the above-described conventional process techniques less desirable in volume production environments.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices including multiple gate transistors or non-planar transistor architectures and corresponding manufacturing techniques in which enhanced overall throughput may be accomplished by avoiding epitaxial growth processes that are conventionally used for forming continuous drain and source areas of multiple gate transistors. To this end, the fins of the multiple gate transistor may be formed in a spatially restricted area of a semiconductor layer that is defined by a mask material, so that a masked portion of the semiconductor material may be used as continuous drain and source areas. In some illustrative aspects, an appropriate placeholder structure may be used for defining the drain and source areas and thereafter the mask material may be formed so as to laterally enclose the placeholder structure, which may subsequently be removed selectively to the mask material, thereby exposing the portion between the drain and source areas in which the fins are to be formed. Consequently, a highly efficient and self-aligned manufacturing technique for providing the fins in a locally restricted manner may be accomplished, while avoiding an epitaxial growth process for forming the continuous drain and source regions. In still other illustrative embodiments, a sophisticated gate electrode structure may be formed after patterning of the fins in a locally restricted manner by using a high-k dielectric material, which is to be understood as a dielectric material having a dielectric constant of 10.0 or higher, in combination with a highly conductive gate electrode material. Consequently, efficient performance increasing mechanisms may be implemented, while nevertheless providing a high throughput process by avoiding an epitaxial growth process for forming the drain and source areas of the non-planar transistor.

One illustrative method disclosed herein comprises forming an opening in a mask material that is formed above a semiconductor layer of a multiple gate transistor, wherein the opening has lateral dimensions corresponding to a gate electrode structure of the multiple gate transistor. Moreover, the method comprises patterning the semiconductor layer within the opening so as to form fins from the semiconductor layer within the opening. Finally, the method comprises forming the gate electrode structure within the opening in the presence of the fins.

A further illustrative method disclosed herein relates to forming a multiple gate transistor. The method comprises forming drain and source regions in a semiconductor layer of the multiple gate transistor on the basis of a gate electrode placeholder structure. Moreover, the method comprises forming a mask material to cover the drain and source regions and forming one or more fins in the semiconductor layer so as to connect to the drain and source regions that are covered by the mask material. Finally, a gate electrode structure is formed above the one or more fins.

One illustrative semiconductor device disclosed herein comprises a continuous drain region and a continuous source region formed in a semiconductor material of a transistor. Moreover, the device comprises a plurality of fins extending between the drain and source regions, wherein each of the fins defines with one end face thereof a first interface with the drain region and defines with another end face thereof a second interface with the source region. Furthermore, the semiconductor device comprises a gate electrode structure formed above the plurality of fins and having a first sidewall that is aligned to the first interface and having a second sidewall that is aligned to the second interface.

BRIEF DESCRIPTION OF THE DRAWINGS

The disclosure may be understood by reference to the following description taken in conjunction with the accompanying drawings, in which like reference numerals identify like elements, and in which.

Figure 1A:
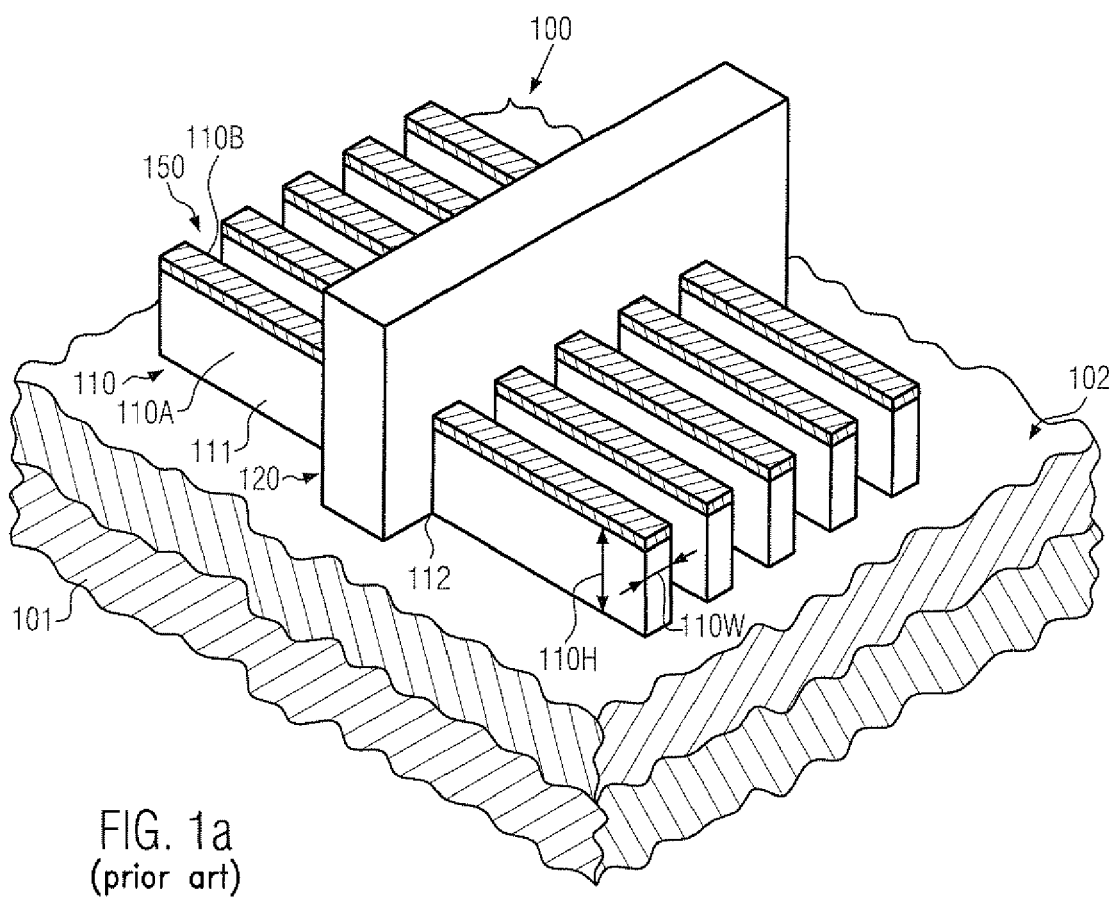
FIG. 1a schematically illustrates a perspective view of a conventional multiple gate transistor in an advanced manufacturing stage.
Figure 1B:
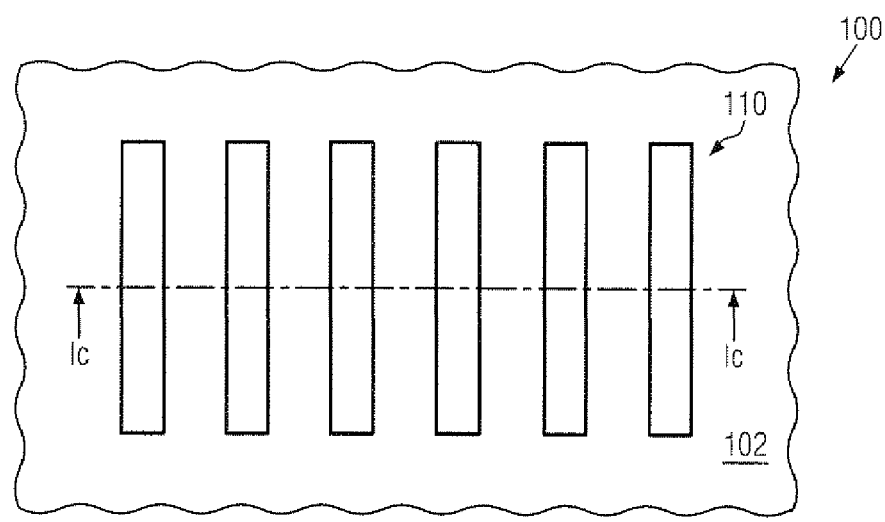
FIGS. 1b-1c schematically illustrate a top view and a cross-sectional view, respectively, of the conventional multiple gate transistor in an early manufacturing stage.
Figure 1C:
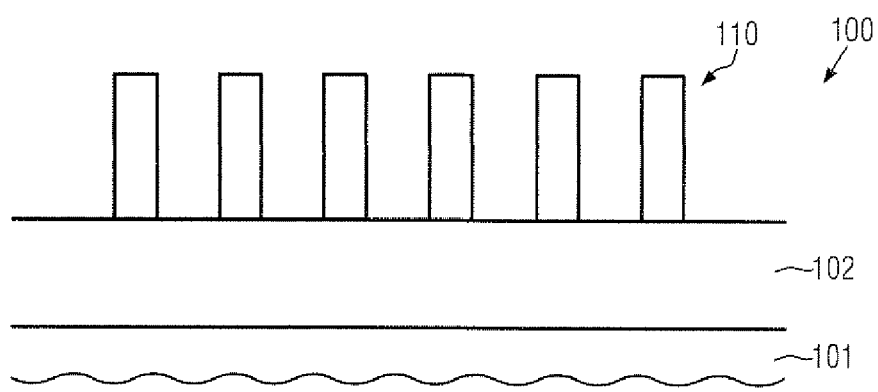
Figure 1D:
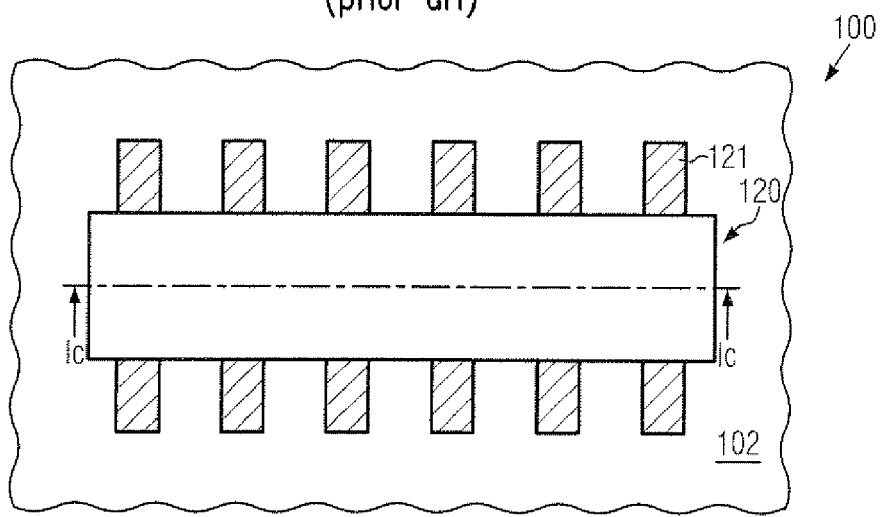
FIGS. 1d-1e schematically illustrate a top view and a cross-sectional view, respectively, of the conventional multiple gate transistor after forming a gate electrode structure.
Figure 1E:
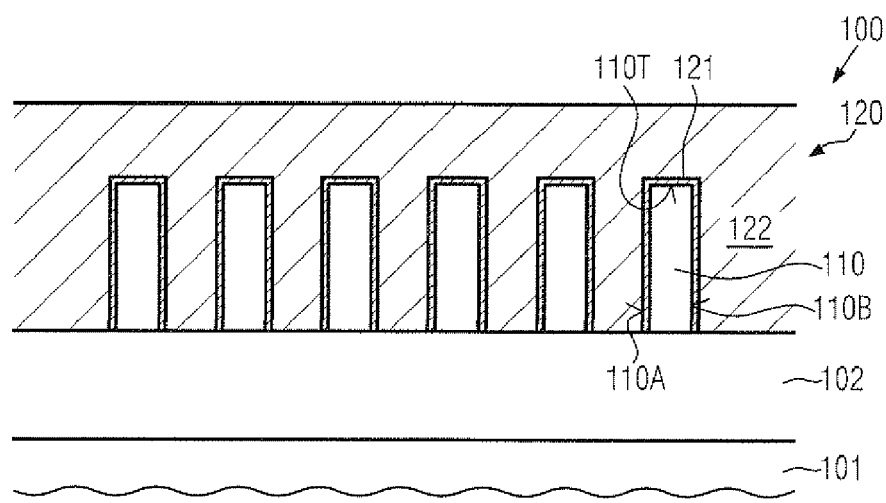
Figure 1F:
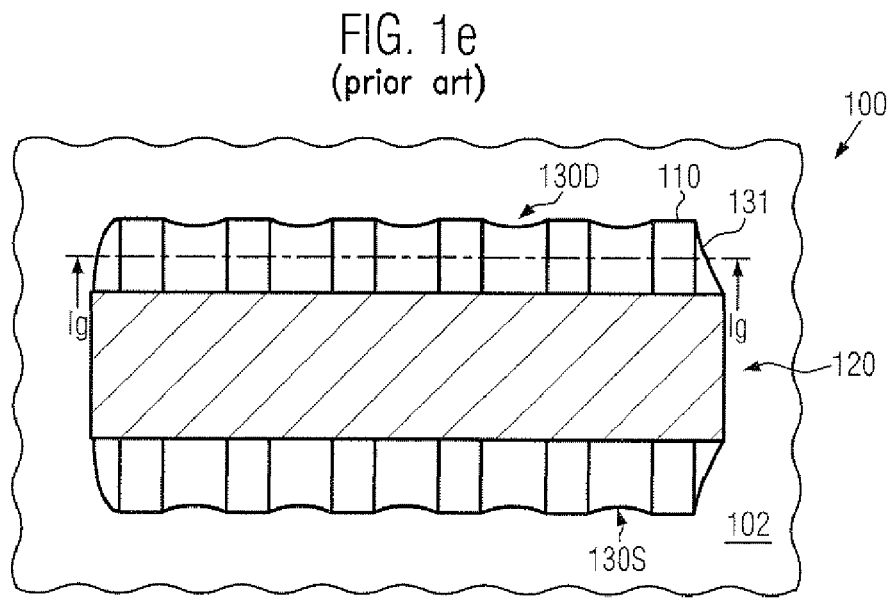
FIGS. 1f-1g schematically illustrate a top view and a cross-sectional view, respectively, of the conventional multiple gate transistor after performing an epitaxial growth process for providing continuous drain and source regions, according to conventional strategies.
Figure 1G:
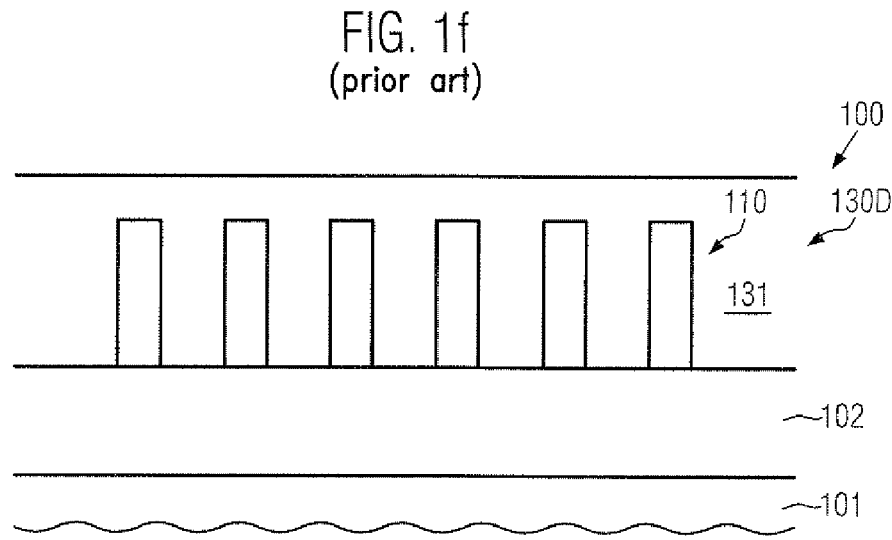

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to enhanced manufacturing techniques and corresponding semiconductor devices in which non-planar transistor configurations, which may also be referred to as multiple gate transistors, may be formed so as to obtain drain and source regions without requiring epitaxial growth techniques. For this purpose, the fins of the multiple gate transistor may be patterned on the basis of a mask material, which may cover the drain and source areas while exposing a portion of the semiconductor material, which may be used as a channel region of the multiple gate transistor. After the patterning of the transistor fins, which may correspond to the channel region of the non-planar transistor configuration, the gate electrode structure may be formed on the basis of the mask material, thereby providing a self-aligned technique with respect to the drain and source regions. In some illustrative embodiments, the gate electrode structure may be formed on the basis of sophisticated materials, such as a high-k dielectric material for the gate insulating material and a metal-containing electrode material, thereby even further enhancing performance of the multiple gate transistor. In some illustrative embodiments, the placeholder structure may be formed on the basis of well-established materials, such as polysilicon in combination with silicon dioxide-based materials, thereby providing a high degree of compatibility with well-established process techniques, which may also be used for the fabrication of planar transistor elements. Consequently, enhanced throughput of the overall manufacturing flow may be accomplished due to the avoidance of complex epitaxial growth techniques and due to the possibility of using well-established process strategies, while at the same time enhanced transistor performance may be accomplished by the non-planar architecture, possibly in combination with the sophisticated gate electrode structure. Hence, performance of transistor devices may further be enhanced by using non-planar transistor architectures while nevertheless providing the potential of employing volume production techniques.

With reference to FIGS. 2a-2j, further illustrative embodiments will now be described in more detail, wherein reference may also be made to FIGS. 1a-1g, if appropriate.

Figure 2A:
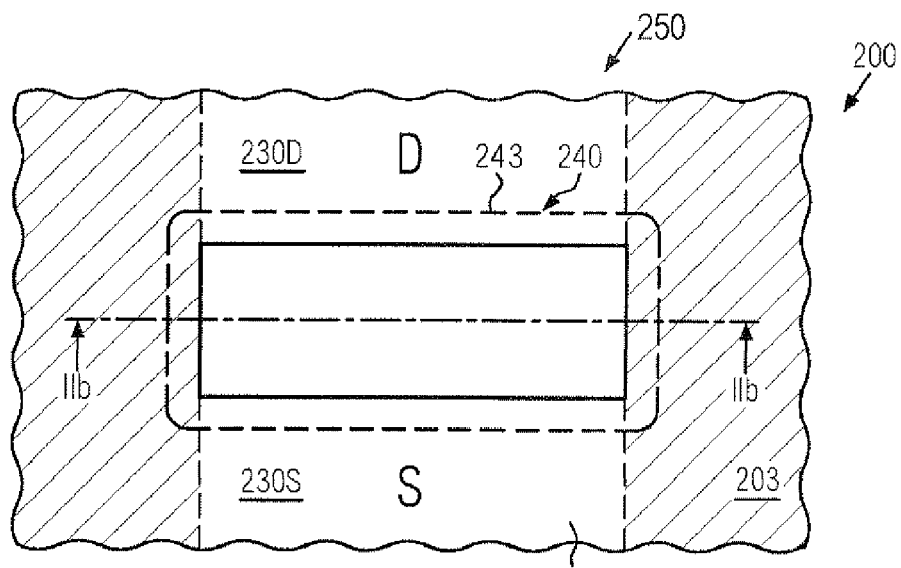
FIGS. 2a-2b schematically illustrate a cross-sectional view and a top view, respectively, of a semiconductor device including a multiple gate transistor or non-planar transistor in an early manufacturing stage, according to illustrative embodiments.

FIG. 2a schematically illustrates a top view of a portion of a semiconductor device 200 which may comprise one or more multiple gate transistors 250 in an early manufacturing stage. It should be appreciated that the term "multiple gate transistor" is to be understood as describing a transistor architecture in which two or more semiconductor surface areas may be used as a channel region. The device 200 may comprise a substrate (not shown in FIG. 2a) having formed thereabove an appropriate semiconductor layer 202, which may be comprised of silicon, silicon/germanium, germanium or any other appropriate semiconductor material that may be used for forming the transistor element 250. It should be appreciated that the semiconductor layer 202 may represent an upper portion of a substantially crystalline semiconductor material, while in other cases a buried insulating layer may be provided, at least partially within the device 200, to define an SOI configuration. Furthermore, the semiconductor material 202 may comprise appropriately designed isolation structures 203, which may define corresponding active regions, i.e., regions in which one or more transistor elements are to be formed, such as the transistor 250. For example, the isolation structure 203 may be provided in the form of a shallow trench isolation which may extend down to a desired depth within the semiconductor layer 202 or which may extend down to a buried insulating layer, if provided. Moreover, in the manufacturing stage shown, the transistor 250 may comprise a placeholder structure 240, the lateral dimensions of which may, according to one illustrative embodiment, substantially correspond to the lateral dimensions of a gate electrode structure of the transistor 250 still to be formed. Furthermore, in the example shown, the placeholder structure 240 may have formed on sidewalls thereof a spacer structure 243 having an appropriate width as may be desired for defining an appropriate dopant profile in corresponding drain and source regions 230D, 230S formed in the semiconductor layer 202. For example, the spacer structure 243 may be used to adjust a lateral offset of a dopant concentration with respect to the placeholder structure 240, which may be replaced by an actual gate electrode structure in a later manufacturing stage.

Figure 2B:
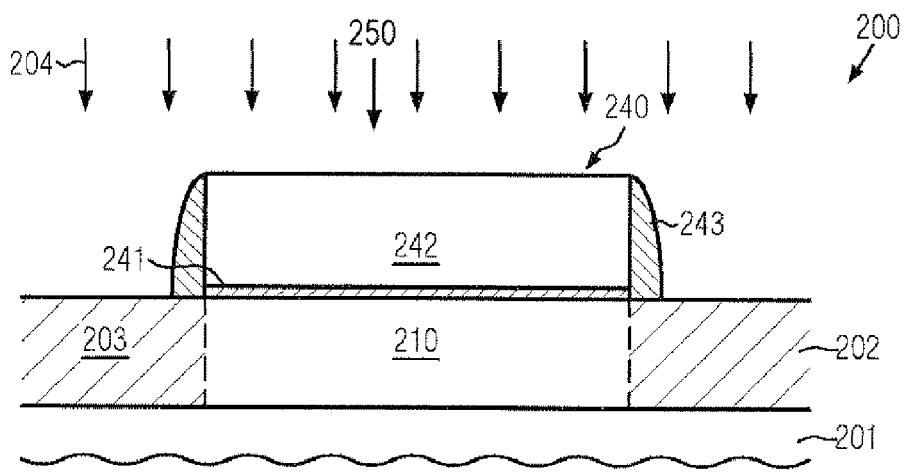

FIG. 2b schematically illustrates a cross-sectional view of the device 200 along the line IIb of FIG. 2a. As illustrated, the placeholder structure 240 may be formed above a portion of the semiconductor layer 202, which is indicated as 210, and which may represent an area of the semiconductor layer 202 in which corresponding fins or non-planar channel regions are to be formed in a later manufacturing stage. The placeholder structure 240 may comprise, in one illustrative embodiment, an etch stop layer 241, for instance in the form of any appropriate material such as silicon dioxide, silicon nitride and the like, while other materials, such as high-k dielectric materials, for instance in the form of hafnium oxide and the like, may also be used. It should be appreciated that, in some illustrative embodiments, the etch stop layer 241 may be used as a gate dielectric material in device regions in which planar transistor elements may be formed based on conventional process techniques. In still other illustrative embodiments, the etch stop material 241 may also be selected so as to act as a hard mask material during the further processing, when patterning the semiconductor region 210 into individual fins. Moreover, a placeholder material 242 may be provided in the structure 240, for instance in the form of a dielectric material, a conductive material such as polysilicon and the like. In one illustrative embodiment, the placeholder material 242 may be provided in the form of a polysilicon material, thereby providing a high degree of compatibility with well-established transistor manufacturing techniques. Furthermore, the spacer structure 243 may be provided, if required, with any appropriate configuration, for instance in the form of one or more spacer elements comprised of silicon nitride, silicon dioxide and the like, possibly in combination with corresponding etch stop liners (not shown), depending on the overall complexity of the spacer structure 243 and the process strategy used.

Figure 2C:
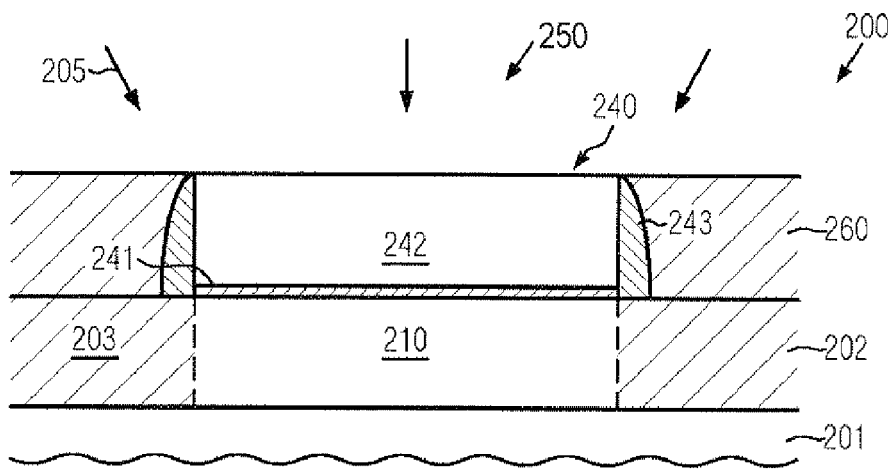
FIGS. 2c-2d schematically illustrate cross-sectional views of the semiconductor device in further advanced manufacturing stages for defining a spatially restricted area for forming fins, according to illustrative embodiments.

The semiconductor device 200 as shown in FIGS. 2a and 2b may be formed on the basis of the following processes. After providing the substrate 201 having formed thereabove the semiconductor layer 202, the isolation structures 203 may be formed, for instance, by well-established manufacturing techniques which are similar to techniques used for forming planar transistor elements. For instance, sophisticated lithography, etch, deposition and planarization techniques may be used for providing the isolation structures 203 so as to define corresponding active areas in the layer 202. Prior to or after forming the isolation structures 203, a desired basic dopant profile may be established in the semiconductor layer 202, for instance for defining a corresponding channel dopant concentration and also adjusting the overall conductivity type of the transistor 250. Next, the etch stop layer 241 may be formed, for instance by oxidation, deposition, or any combination thereof, surface treatment and the like. In some illustrative embodiments, an appropriate material may be used to withstand subsequent high temperature processes that may be employed during the further processing of the device 200. Thereafter, the material 242 may be deposited, for instance on the basis of well-established chemical vapor deposition (CVD) techniques, followed by a sophisticated patterning regime, which may be based on lithography and etch techniques. Thus, during the corresponding patterning process, the lateral dimensions of the placeholder structure 240 may be defined and may correspond, in some illustrative embodiments, to the lateral dimensions of a gate electrode structure of the transistor 250. During the patterning of the material 242, the layer 241 may act as an etch stop material wherein, as previously explained, a plurality of well-established etch recipes are available. Next, a sequence of implantation processes 204 may be performed, for instance on the basis of the spacer structure 243 with any appropriate configuration in order to establish a desired dopant concentration and profile in the drain and source regions 230D, 230S (see FIG. 2a). It should be appreciated that, in other illustrative embodiments, additional process steps may be implemented, for instance with respect to providing additional performance-enhancing mechanisms. For example, a strain-inducing material may be incorporated into the drain and source areas 230D, 230S in order to create a tensile or compressive strain component along the current flow direction in the region 210, which is the direction perpendicular to the drawing plane of FIG. 2b. For this purpose, strain-inducing semiconductor alloys, such as silicon/germanium, silicon/carbon and the like, may be incorporated into a silicon base material in order to obtain the desired strain component. Thereafter, any heat treatment may be performed so as to obtain the finally desired overall dopant profile in the drain and source regions 230D, 230S FIG. 2c schematically illustrates the semiconductor device 200 in a further advanced manufacturing stage. As illustrated, a dielectric material 260 may be formed so as to laterally enclose the placeholder structure 240. The dielectric material 260, which may also be referred to as a mask material, may thus cover the drain and source areas 230D, 230S (FIG. 2a) while exposing the material 242 of the structure 240. The dielectric material 260 may be formed after completing the process sequence described above with reference to FIGS. 2a and 2b, for instance by depositing any appropriate material, such as silicon dioxide, silicon nitride, nitrogen-containing silicon carbide and the like. After the deposition of the material 260, a planarization process may be performed, which may comprise a chemical mechanical polishing (CMP) process, thereby planarizing the surface topography, wherein the planarization process may be continued until the placeholder material 242 is exposed. Thereafter the device 200 may be subjected to an etch process 205 that is designed to remove the material 242 selectively to the dielectric material or mask material 260 and also selectively to the etch stop material 241, when an exposure of the material 210 to the etch ambient 205 is deemed inappropriate. For example, a plurality of well-established highly selective etch recipes are available for polysilicon material which may efficiently be removed selectively to silicon dioxide material. It should be appreciated, however, that any other material compositions may be selected for the mask material 260 and the placeholder material 242, as long as the material 242 may be selectively removed with respect to the mask material 260. In one illustrative embodiment, the material 242, provided in the form of a polysilicon material, may be efficiently removed on the basis of a wet chemical etch recipe using TMAH (tetra methyl ammonium hydroxide). TMAH may efficiently etch silicon material at elevated temperatures in the range of approximately 50-80° C., while nevertheless providing a high degree of selectivity with respect to silicon nitride and silicon dioxide. Consequently, material 242 may be efficiently removed while at the same time the etch process may be reliably stopped at the layer 241 when provided in the form of a silicon dioxide material, a silicon nitride material and the like.

Figure 2D:
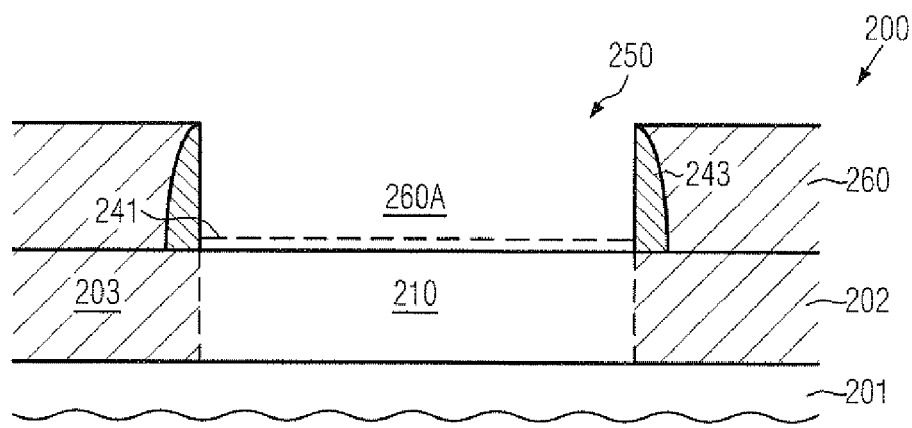

FIG. 2d schematically illustrates the semiconductor device 200 after the removal of the material 242 (FIG. 2c), thereby forming an opening 260A in the mask material 260, wherein also the spacer structure 243 may be maintained. Furthermore, in one illustrative embodiment, the etch stop material 241 may be removed within the opening 260A by performing an additional etch process, such as a wet chemical etch process using well-established recipes. For example, silicon dioxide material may be efficiently removed by hydrofluoric acid and the like. In other illustrative embodiments, the etch stop layer 241 may be maintained and may be used as a hard mask material for patterning the semiconductor region 210 in a subsequent manufacturing stage. Thus, after forming the opening 260A, a lithography process may be performed to form a resist mask that may define the lateral dimensions of corresponding fins of the transistor 250. For this purpose, in some illustrative embodiments, the opening 260A may be filled with an appropriate material, such as a polymer material, a resist material and the like, which may additionally be used as an ARC material in order to enhance performance of the subsequent lithography process.

Figure 2E:
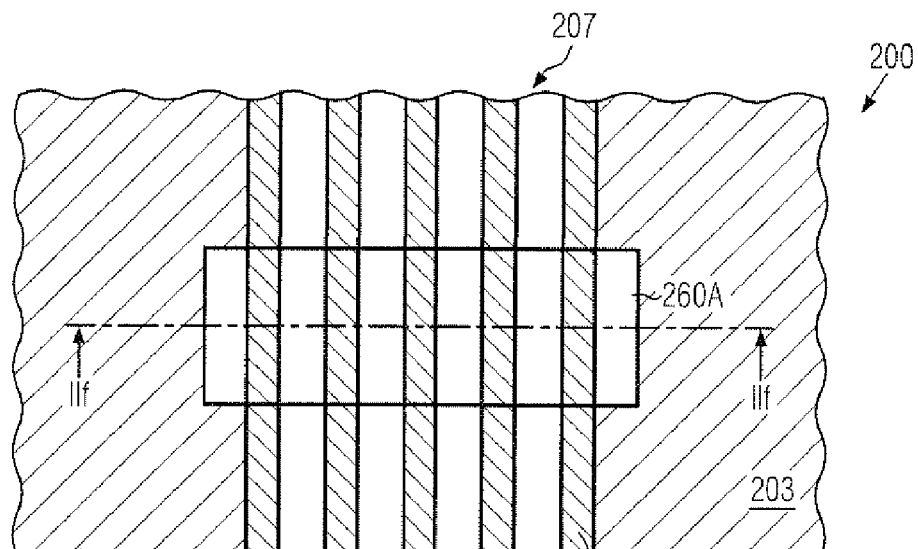
FIGS. 2e-2f schematically illustrate a top view and a cross-sectional view, respectively, in a manufacturing stage during the patterning of an exposed portion of a semiconductor layer, according to illustrative embodiments.

FIG. 2e schematically illustrates a top view of the device 200 wherein respective resist features 207A of a resist mask 207 may be provided so as to extend along a channel length direction across the opening 260A, thereby defining the size and position of the corresponding fins still to be formed.

Figure 2F:
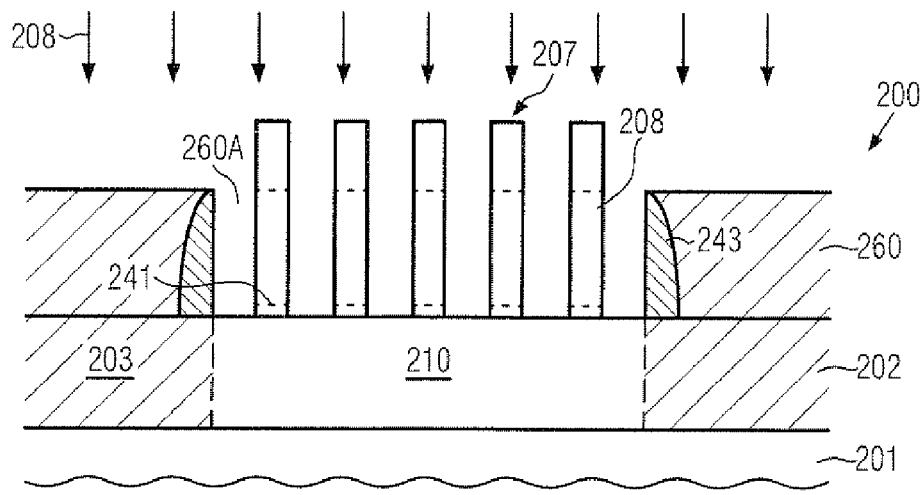

FIG. 2f schematically illustrates a cross-sectional view of the device of FIG. 2e. As illustrated, the resist mask 207 may be formed on a corresponding fill material 208, for instance a further resist material, a polymer material and the like, as previously explained. For example, materials may be applied by spin-on techniques, possibly in combination with a subsequent planarization process. Thereafter, the actual resist material may be provided and may be patterned by lithography. Thereafter, the fill material 208 may be patterned on the basis of an appropriate etch recipe. It should be appreciated that other process strategies may be used, for instance the fill material 208 may represent a part of a resist material of the etch mask 207, when appropriate exposure conditions may be accomplished within the opening 260A. In other illustrative embodiments, the etch mask 207 may be used for patterning the etch stop layer 241, thereby providing less critical lithography conditions since, for instance, a reduced thickness of the resist mask 207 may be used. After providing the mask 207, the device 200 may be exposed to an etch ambient 208 that is designed to transfer the pattern of the etch mask 207 or of the hard mask 241 into the semiconductor region 210. For this purpose, well-established anisotropic etch recipes are available for a plurality of materials, such as silicon, silicon/germanium and the like. During the etch process 208, the mask material 260 may reliably cover the drain and source areas 230D, 230S (FIG. 2a).

Figure 2G:
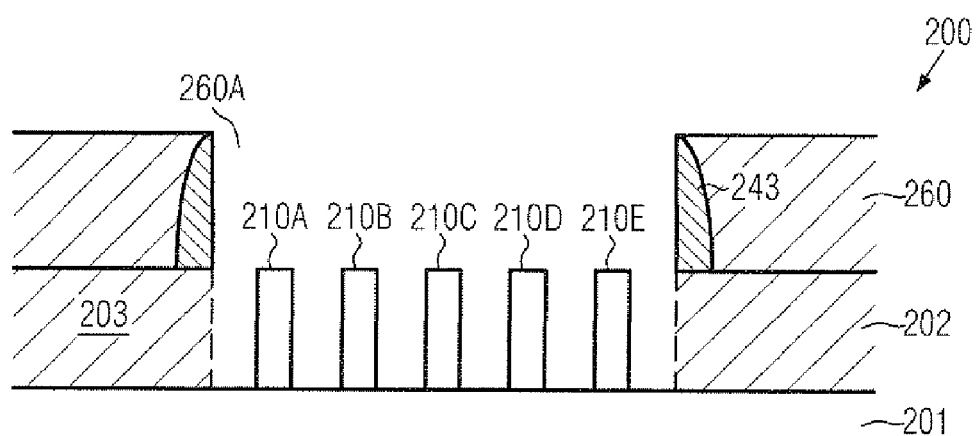
FIGS. 2g-2i schematically illustrate cross-sectional views of the semiconductor device during various manufacturing stages in forming a sophisticated gate electrode structure, according to still further illustrative embodiments.

FIG. 2g schematically illustrates the semiconductor device 200 after the etch process 208 and the removal of the etch mask 207, 208 or after the removal of the hard mask 241. Thus, as illustrated, corresponding fins 210A, 210B, 210C, 210D, 210E are formed from the semiconductor region 210 (FIG. 2f), wherein the lateral dimensions of the fins 210A, 210B, 210C, 210D, 210E are substantially determined by the etch mask 207 (FIG. 2f), while a height thereof may be determined by a thickness of the initial semiconductor layer 202 or the corresponding etch parameters, such as the etch time for a given removal rate. On the other hand, the extension of the fins 210A, 210B, 210C, 210D, 210E along the current flow direction or channel length direction, i.e., in FIG. 2g, the direction perpendicular to the drawing plane, is substantially determined by the corresponding dimension of the opening 260A.

Figure 2H:
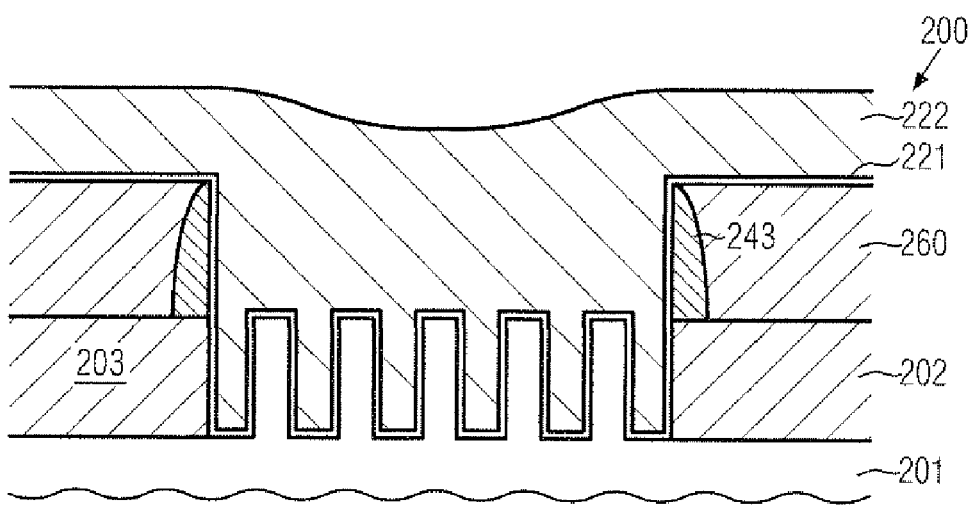

FIG. 2h schematically illustrates the semiconductor device 200 in a further advanced manufacturing stage in which a gate dielectric material 221 may be formed on the mask material 260 and on exposed surface portions of the fins 210A, 210B, 210C, 210D, 210E (FIG. 2g). In some illustrative embodiments, the gate dielectric material 221 may be provided in the form of a high-k dielectric material, such as one or more of the materials previously explained in the context of conventional planar transistor architectures. Furthermore, a gate electrode material 222 is formed so as to reliably fill the opening 260A (FIG. 2g). For example, the gate electrode material 222 may be provided as a metal-containing material, for instance in the form of a titanium nitride material, tungsten and the like, so as to obtain an appropriate work function with respect to the channel regions provided by the fins 210A, 210B, 210C, 210D, 210E. The gate dielectric material 221 may be formed, for instance, by oxidation, deposition and the like, on the basis of well-established process techniques. Similarly, the material 222 may be deposited by using available process recipes which may also be used in the formation of planar transistor architectures.

Figure 2I:
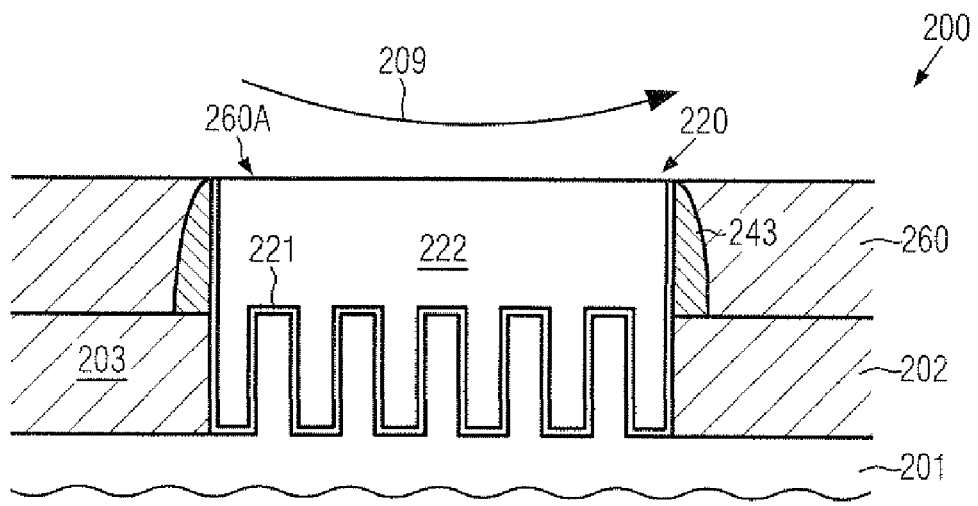

FIG. 2i schematically illustrates the semiconductor device 200 during a planarization process 209, which may comprise a CMP process and the like. During the planarization process 209, excess material of the gate electrode material 222 may be removed thereby forming a gate electrode structure 220 comprising the gate electrode material 222 and the gate dielectric material 221. In the embodiment shown, the planarization process 209 may be continued so as to reliably remove any conductive material from above the mask material 260, which, for instance, may also result in the removal of the gate dielectric material 221 outside of the opening 260A.

Figure 2J:
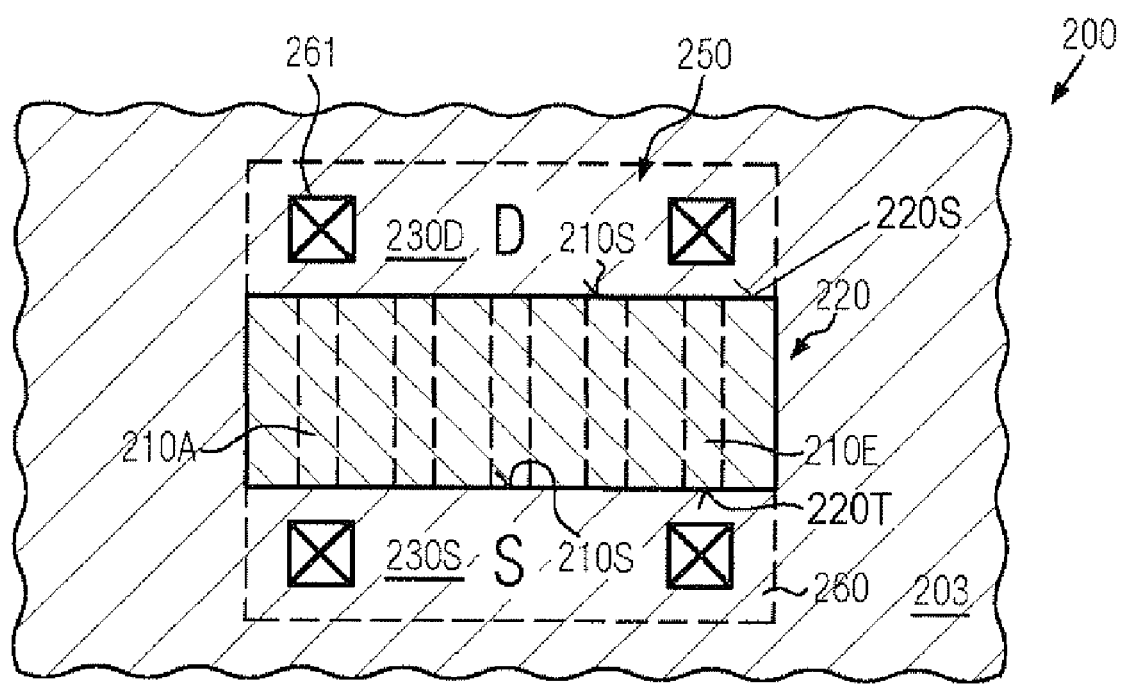
FIG. 2j schematically illustrates a top view of the semiconductor device including a multiple gate transistor in a further advanced manufacturing stage, according to still further illustrative embodiments.

FIG. 2j schematically illustrates a top view of the semiconductor device 200 after the above-described process sequence. As illustrated, the device 200 comprises the multiple gate transistor 250 with the gate electrode structure 220, the lateral dimension of which is substantially determined by the placeholder structure 240 (FIG. 2a). Furthermore, the fins 210A . . . 210E, indicated as dashed lines, extend between the drain and source regions 230D, 230S which may still be covered by the mask material 260. As illustrated, due to the previous process strategy, each of the fins 210A . . . 210E has a first end face 210S connecting to the drain region 230D and also has a second end face 210T connecting to the source region 230S. Furthermore, the first end faces 210S may be aligned to a first sidewall 220S of the gate electrode structure 220 and similarly the second end faces 210T may be aligned to a second sidewall 220T. Consequently, the drain and source regions 230D, 230S may be provided without performing any epitaxial growth techniques, which are typically used in conventional process strategies, by spatially restricting the fins 210A . . . 210E to the area covered by the gate electrode structure 220. Furthermore, in some illustrative embodiments, the gate electrode structure 220 may be provided on the basis of sophisticated high-k dielectric materials in combination with metal-containing highly conductive electrode materials. After forming the gate electrode structure 220, the further processing may be continued by providing a further dielectric material and forming thereon and therein one or more metallization layers in accordance with the overall process requirements. Furthermore, corresponding contact elements 261 may be formed in the mask material 260 prior to or after providing an additional dielectric material, wherein well-established process techniques may be used.

As a result, the present disclosure provides multiple gate transistors and corresponding manufacturing techniques in which reduced cycle times and thus enhanced throughput may be accomplished by avoiding at least one epitaxial growth process, compared to conventional strategies, while at the same time well-established process techniques may be used, which may be available for process techniques for fabricating planar transistor elements. In some illustrative embodiments, a placeholder structure may be used for defining the drain and source regions prior to forming the corresponding transistor fins, which may be patterned in the semiconductor material in a spatially restricted manner by removing the placeholder structure. Consequently, the corresponding fins may extend across gate electrode structures only and may terminate in the drain and source regions. It should be appreciated that the principles disclosed herein may be efficiently applied to any type of multiple gate transistors, for instance P-channel transistors and N-channel transistors, wherein the corresponding process sequence may be applied individually to each of the transistor types, while in other cases both transistor types may be formed in a common manufacturing sequence. That is, the drain and source regions may be defined on the basis of well-established masking regimes on the basis of corresponding placeholder structures. Thereafter, the placeholder structure may be removed in a common process sequence, as described above, and the corresponding fins for the different types of transistors may be defined on the basis of a process sequence as described above. Thereafter, gate electrode material may be provided in different process steps in order to appropriately adapt the work function of the gate electrode material to the type of transistor under consideration. For this purpose, for instance, one type of transistor may be masked while the gate electrode material for one type of transistor may be deposited and after removal of any excess material the mask may be removed, which may be provided, for instance, in the form of a fill material, and a further gate electrode material may be deposited and may be planarized by CMP and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming an opening in a mask material formed above a semiconductor layer of a multiple gate transistor, said opening having lateral dimensions corresponding to a gate electrode structure of said multiple gate transistor;
    forming a resist mask within the opening to define lateral dimensions of fins of said multiple gate transistor;
    patterning said semiconductor layer within said opening using the resist mask so as to form fins from said semiconductor layer within said opening; and
    forming said gate electrode structure within said opening in the presence of said fins.

2. The method of claim 1, wherein forming said opening comprises forming a placeholder structure and sidewall spacers formed on sidewalls of the gate electrode placeholder structure above said semiconductor layer, laterally embedding said placeholder structure and said sidewall spacers in said mask material and removing said placeholder structure selectively to said mask material.

3. The method of claim 1, wherein forming said gate electrode structure comprises forming a gate dielectric material on said fins and forming a gate electrode material in said opening.

4. The method of claim 1, further comprising forming drain and source regions prior to patterning said semiconductor layer within said opening.

5. The method of claim 1, further comprising forming drain and source regions after forming said gate electrode structure.

6. The method of claim 2, further comprising forming drain and source regions on the basis of said placeholder structure and said sidewall spacers.

7. The method of claim 2, wherein forming said placeholder structure comprises forming an etch stop layer and depositing a dielectric material on said etch stop layer.

8. The method of claim 2, wherein said placeholder structure comprises polysilicon.

9. The method of claim 3, wherein said gate dielectric material comprises a high-k dielectric material.

10. The method of claim 3, wherein said gate electrode material comprises a metal-containing material.

11. The method of claim 8, wherein said polysilicon is removed by performing a wet chemical etch process.

12. The method of claim 11, wherein said wet chemical etch process is performed on the basis of TMAH (tetra methyl ammonium hydroxide).

13. A method of forming a multiple gate transistor, the method comprising:
    forming drain and source regions in a semiconductor layer of said multiple gate transistor on the basis of a gate electrode placeholder structure and sidewall spacers formed on sidewalls of the gate electrode placeholder structure;
    forming a mask material so as to cover said drain and source regions;
    forming one or more fins in said semiconductor layer so as to connect to said drain and source regions covered by said mask material; and
    forming a gate electrode structure above said one or more fins.

14. The method of claim 13, wherein forming said gate electrode structure comprises forming a gate dielectric material on at least exposed surface areas of said fins and depositing a gate electrode material above said gate dielectric material.

15. The method of claim 13, further comprising forming said gate electrode placeholder structure by forming an etch stop layer, depositing a placeholder material on said etch stop layer and patterning said placeholder material so as to have lateral dimensions that correspond to said gate electrode structure, and further comprising forming the sidewall spacers on sidewalls of said gate electrode placeholder structure to adjust a lateral offset of a dopant concentration in the source and drain regions with respect to the placeholder structure.

16. The method of claim 13, wherein said gate electrode structure comprises a high-k dielectric material and a metal-containing electrode material that is in contact with said high-k dielectric material.

17. The method of claim 14, further comprising removing excess material of said gate electrode material from above said mask material.

18. The method of claim 15, wherein said placeholder material is comprised of polysilicon.

19. A method of forming a multiple gate transistor, the method comprising:
   forming drain and source regions in a semiconductor layer of said multiple gate transistor on the basis of a gate electrode placeholder structure;
   forming a mask material so as to cover said drain and source regions;
   forming one or more fins in said semiconductor layer so as to connect to said drain and source regions covered by said mask material, wherein forming said one or more fins comprises removing said gate electrode placeholder structure, forming an etch mask and patterning said semiconductor layer on the basis of said etch mask selectively to said mask material covering said drain and source regions; and
   forming a gate electrode structure above said one or more fins.

* * * * *